United States Patent
Yoshida et al.

(10) Patent No.: US 6,995,055 B2
(45) Date of Patent: Feb. 7, 2006

(54) STRUCTURE OF A SEMICONDUCTOR INTEGRATED CIRCUIT AND METHOD OF MANUFACTURING THE SAME

(75) Inventors: Yoshifumi Yoshida, Chiba (JP); Miwa Wake, Chiba (JP)

(73) Assignee: Seiko Instruments Inc., Chiba (JP)

( * ) Notice: Subject to any disclaimer, the term of this patent is extended or adjusted under 35 U.S.C. 154(b) by 48 days.

(21) Appl. No.: 10/360,117

(22) Filed: Feb. 7, 2003

(65) Prior Publication Data

US 2003/0155615 A1 Aug. 21, 2003

(30) Foreign Application Priority Data

Feb. 21, 2002 (JP) .............................. 2002-045033

(51) Int. Cl.
*H01L 21/8238* (2006.01)

(52) U.S. Cl. ...................... 438/199; 438/149; 438/153; 438/154; 438/202; 438/203; 438/228; 438/311

(58) Field of Classification Search ................ 438/149, 438/153, 154, 155, 199, 202, 203, 223, 224, 438/227, 228, 309, 311, 542, 560; 257/350, 257/351, 369, 371

See application file for complete search history.

(56) References Cited

U.S. PATENT DOCUMENTS

| | | | | |
|---|---|---|---|---|
| 5,620,922 A | * | 4/1997 | Yoshida et al. | 438/210 |
| 5,882,965 A | * | 3/1999 | Schwalke et al. | 438/227 |
| 6,368,936 B1 | * | 4/2002 | Yoshida | 438/401 |
| 6,440,802 B1 | * | 8/2002 | Hayashi et al. | 438/275 |
| 6,451,633 B1 | * | 9/2002 | Yoshida | 438/151 |
| 6,740,551 B2 | * | 5/2004 | Yoshida et al. | 438/199 |
| 2003/0054594 A1 | * | 3/2003 | Yoshida et al. | 438/154 |

* cited by examiner

*Primary Examiner*—Maria F. Guerrero
(74) *Attorney, Agent, or Firm*—Adams & Wilks

(57) ABSTRACT

A method of fabricating CMOS transistors of first and second conductivity types in an SOI substrate includes the steps of etching contact holes and alignment marks through the semiconductor and insulating films and into the support substrate of an SOI substrate, forming a thermal oxide film on the semiconductor layer inside the contact holes, forming back regions of the CMOS transistors in the substrate, forming a well regions of the CMOS transistors in the semiconductor film, forming a gate oxide film, gate electrodes, source regions, drain regions, and body regions, forming an interlayer insulating film, forming contacts of the source regions, drain regions, and body regions, forming openings in the interlayer insulating film over the contact holes, and forming wiring on the interlayer insulating film.

27 Claims, 8 Drawing Sheets

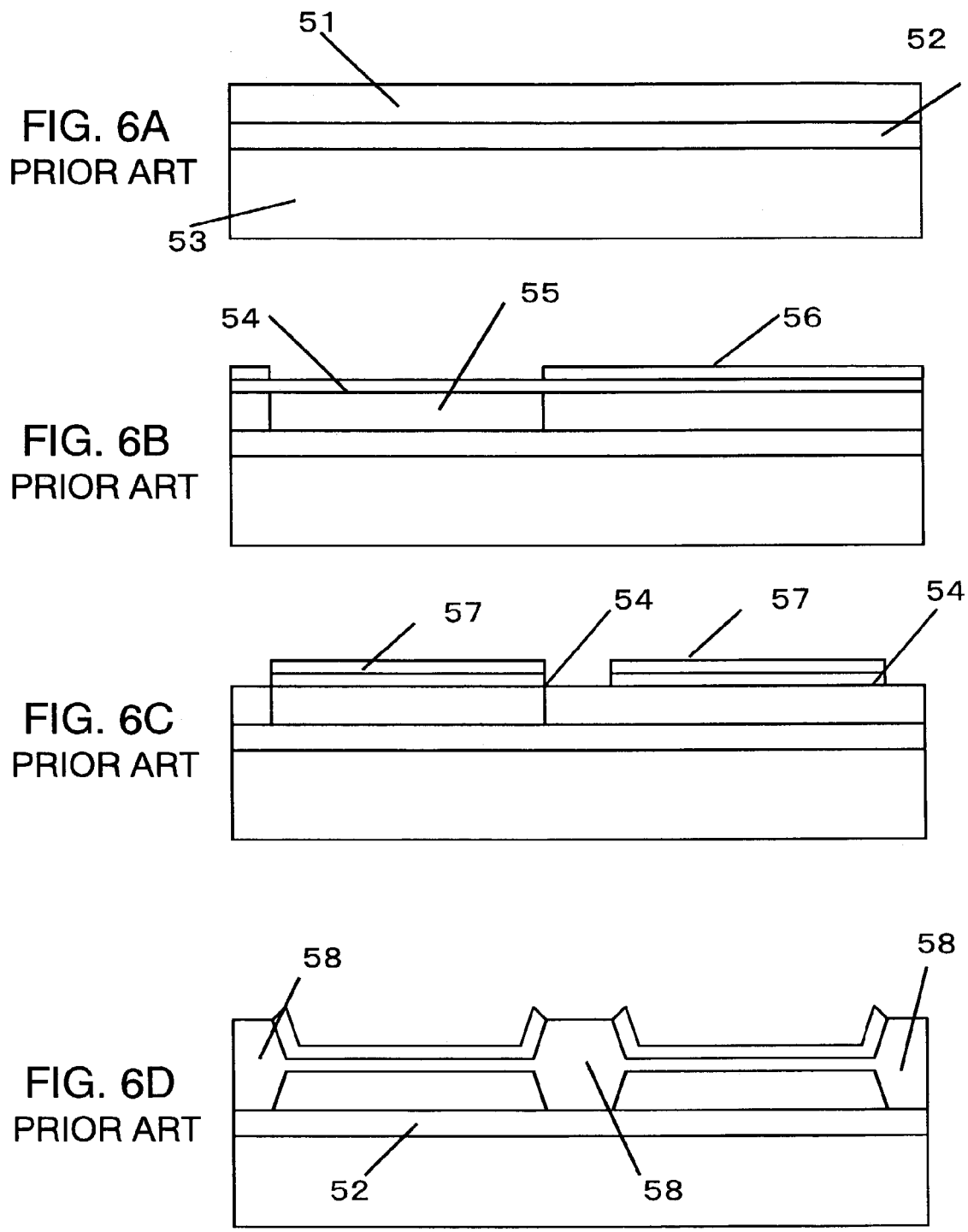

STRUCTURE OF A SEMICONDUCTOR INTEGRATED CIRCUIT AND METHOD OF MANUFACTURING THE SAME

BACKGROUND OF THE INVENTION

1. Field of the Invention

The present invention relates to a method of forming a transistor on an SOI wafer and has a structure capable of preventing a potential of a support substrate below a buried insulating film from significantly affecting the characteristics of the transistor. More specifically, the present invention relates to a transistor having a so-called gate sub-connection structure in which a gate electrode and a body region of the transistor are connected to each other.

2. Description of the Related Art

FIGS. 6A to 7C illustrate a conventional method of manufacturing an SOI transistor, and FIGS. 8A and 8B are respectively a top view and a sectional view of the structure of the conventional SOI transistor. Conventionally, a transistor is formed by using a wafer in which a P-type semiconductor film 51 is formed on a P-type support substrate 53 via a buried insulating film 52.

In the structure of the conventional SOI transistor that is formed on the semiconductor film 51 formed on a support substrate 53 via a buried insulating film 52, the transistor is formed on the semiconductor film 51 in a region surrounded by a LOCOS region 58 reaching the buried insulating film as shown in FIG. 8B, and each transistor is completely isolated by the LOGOS region 58. In the case of an N-type transistor, since the semiconductor film 51 is of a P-type, the transistor is formed by implanting N-type ions into source/drain regions 64 and 76, as shown in FIG. 8A. On the other hand, in the case of a P-type transistor, the transistor is formed by implanting N-type ions into the semiconductor film 51 surrounded by the LOGOS region 58, and implanting P-type ions into source/drain regions 63 and 75 under the condition that the semiconductor film 51 is kept in an N-type as shown in FIG. 8A. Then, potentials of body regions 82 and 83 below gate electrode 60 are controlled through body contact regions 61 and 62, and body contacts 65 and 66. In order to achieve a higher speed operation of the transistor, in the case of the P-type transistor, the gate electrode 60 and the body contact 65 of the P-type transistor are connected to each other through a wiring layer 69. In the case of the N-type transistor, the gate electrode 60 and the body contact 66 of the N-type transistor are connected to each other through a wiring layer 70.

Further, the manufacturing method is shown in FIG. 6A to 7C. As shown in FIG. 6A, patterning and etching are conducted so as to imprint an alignment mark on the semiconductor film 51 formed on the support substrate 53 via the buried insulating film 52. Next, as shown in FIG. 6B, a thermal oxide film 54 is formed, and a resist 56 is applied thereto. Then, alignment and exposure to light are conducted, and patterning for the purpose of implanting an N well 55 is connected. Next, ions are implanted using the resist 56 as a mask to form the N well 55. At this time, the energy of ion implantation is controlled so that the semiconductor film can have the peak of a concentration distribution. Thereafter, heat treatment is conducted so that the implanted ions are activated and diffused. Then, as shown in FIG. 6C, nitride films 57 are formed on the thermal oxide films 54 and are subjected to patterning and etching. Then, as shown in FIG. 6D, thermal oxidation is performed to form the LOCOS region 58. At this time, thermal oxidation is conducted so that the LOCOS region 58 reaches the buried insulating film 52. After forming the LOGOS region 58, as shown in FIG. 7A, gate oxide films 59 are formed and gate electrodes 60 are formed. Although not shown in FIG. 7A, in the transistors shown in FIG. 8A, ions are implanted into source/drain regions 63, 64, 75, and 76 and body contact regions 61 and 62, and an interlayer insulating film 71 is formed. Subsequently, as shown in FIG. 7B, the interlayer insulating film 71 is patterned and etched to form the gate electrodes 60, body contacts 80 and 81 of the body contact regions 61 and 62 and, although not shown in FIG. 7B, contacts 67, 68, 77, and 78 of the source/drain regions of FIG. 8A.

Next, as shown in FIG. 7C, metal is formed into a film and is patterned to form wirings 69 and 70. In the transistor of the gate sub-connection structure, the respective gate electrodes 60 are connected to the body contact regions 61 and 62.

In this case, the buried insulating film 52 is disposed between the support substrate 53 and the semiconductor film 51, 50 that a potential of the support substrate 53 is in a floating state. In the SOI transistor, the potential of the support substrate 53 affects the characteristics of the transistor, so that it is required to fix the potential of the support substrate 53. The potential of the support substrate 53 is generally set by attaching the support substrate 53 to a conductive base using a conductive adhesive when being mounted in a package, so that the potential is taken from the base. Generally, the support substrate is connected to a ground terminal or a power source voltage terminal.

There is also another method of taking the potential of the support substrate side from the semiconductor film side. Specifically, a through-hole is provided so as to reach a part of the support substrate 53 through the semiconductor film 51 and the buried insulating film 52, thereby taking a potential. In this case, in the same way as in a method of taking a substrate potential of a bulk transistor, a through-hole is provided on the periphery of the transistor so as to reach a part of the support substrate 53 through the semiconductor film 51 and the buried insulating film 52, and the potential of the support substrate 53 is taken.

According to the conventional method of forming an SOI transistor, since there is a buried insulating film between a support substrate and a semiconductor film, a transistor on the semiconductor film is not electrically connected to the support substrate, and the potential of the support substrate is floated. However, in a complete depletion type SOI transistor and the like, a semiconductor film is entirely depleted in the thickness direction and depletion reaches a buried insulating film. Therefore, the potential of the support substrate greatly affects the characteristics of the transistor, and a change in potential of the support substrate exhibits the same characteristics as that of a back gate effect of a bulk transistor. Therefore, it is required to fix the potential of the support substrate. Generally, according to the method of fixing the potential of the support substrate, the support substrate is attached to the conductive base by the conductive adhesive when being mounted in the package, and the potential of the base is fixed, so that the potential of the support substrate is fixed. The potential of the support substrate is connected to the ground terminal or the power source voltage terminal.

However, even if the body contact region is connected to the gate electrode to achieve the gate sub-connection structure, since the potential of the support substrate does not change, it is difficult to obtain ideal subthreshold characteristics.

Furthermore, in the SOI transistor from a structural view, there is a back side transistor in which a support substrate is considered as a gate electrode, and a buried insulating film is considered as a gate oxide film. Thus, a threshold voltage of the back side transistor is low. Then, when the power source voltage increases, the back side transistor is turned ON to decrease a withstand voltage thereof.

Further, as the method of taking a potential of the support substrate side from the semiconductor film side, the through-hole may be formed so as to reach a part of the support substrate through the semiconductor film and the buried insulating film to thereby take a potential. However, also in this system, the potential of the entire support substrate changes, which not only makes impossible to obtain ideal subthreshold characteristics but also causes characteristic change in a circuit for which a back gate effect is not required. This leads to a defective circuit operation.

SUMMARY OF THE INVENTION

The present invention has been made in view of the above-mentioned problem. According to the present invention, there is provided a method of manufacturing a semiconductor integrated circuit in which a CMOS transistor is formed on a semiconductor film of a first conductivity type formed on a support substrate of a first conductivity type via a buried insulating film, including: forming at least one contact hole in a source-body-tie region adjacent to a body region under a source region and a gate electrode of a transistor so that the contact hole reaches a part of the support substrate through the semiconductor film and the buried insulating film on the support substrate, together with alignment marks; forming a thermal oxide film on an inner side of the contact hole on the semiconductor film; forming impurity regions of a second conductivity type in regions where transistors of a first conductivity type and a second conductivity type are to be formed, which reach an inner portion of the support substrate under the buried insulating film; performing thermal diffusion on the impurity regions of a second conductivity type; forming an impurity region of a first conductivity type in a region where a transistor of a second conductivity type is to be formed, which reaches the buried insulating film on the semiconductor film; forming an impurity region of a first conductivity type in a portion on the support substrate and opposing the impurity region of a first conductivity type with respect to the buried insulating film; forming an impurity region of a second conductivity type in a region where a transistor of a first conductivity type is to be formed, which reaches the buried insulating film on the semiconductor film; forming a gate oxide film, a gate electrode, a source region, and a drain region after separating elements, and forming an interlayer insulating film; forming contacts of the source region and the drain region, and simultaneously, etching the interlayer insulating film so as to be concentric with the contact hole and to have a size surrounding the contact hole; and forming a wiring on the interlayer insulating film.

Also, according to the present invention, there is provided a semiconductor integrated circuit, including: a gate oxide film; a gate electrode; source and drain regions; a body region formed below the gate electrode; a body contact region connected with the body region; a body contact for connecting the body contact region with a metal wiring; impurity regions of a second conductivity type formed in regions where transistors of a first conductivity type and a second conductivity type are to be formed, which reach an inner portion of the support substrate under the buried insulating film; an impurity region of a first conductivity type formed in a region where the transistor of a second conductivity type is to be formed, which reaches the buried insulating film on the semiconductor film; an impurity region of a first conductivity type formed in a portion on the support substrate and opposing the impurity region of a first conductivity type with respect to the buried insulating film; an impurity region of a second conductivity type formed in a region where a transistor of a first conductivity type is to be formed, which reaches the buried insulating film on the semiconductor film; and contact holes reaching a part of the support substrate through the buried insulating film on the support substrate, in which the contact holes are formed in positions concentric with body contacts of the transistors of a first conductivity type and a second conductivity type.

With this structure, in the case where the body contact region is connected with the gate electrode to achieve a gate sub-connection structure, it is possible to allow a body potential of the transistor and a potential on the support substrate below the transistor to vary in accordance with change in a potential of the gate electrode. Thus, ideal subthreshold characteristics can be obtained. As a result, the semiconductor integrated circuit with high performance can be realized.

Furthermore, in an SOI transistor from a structural view, there is a transistor in which the support substrate is considered as a gate electrode, and the buried insulating film is considered as a gate oxide film. Therefore, particularly in the case of a P-type transistor, a threshold voltage in a back side transistor is low, which causes a withstand voltage to decrease. However, in an SOI transistor according to the present invention, the gate electrode of the back side transistor of the P-type transistor is of an N-type, so that the threshold voltage increases due to work function difference to increase the withstand voltage.

BRIEF DESCRIPTION OF THE DRAWINGS

In the accompanying drawings:

FIGS. 6A to 6D are views illustrating a process flow (1) of a conventional manufacturing method;

DESCRIPTION OF THE PREFERRED EMBODIMENTS

The present invention will be described by way of an embodiment with reference to FIGS. 1A to 5B. A transistor described according to the present invention relates to a so-called SOI transistor formed on a silicon layer on an insulating film (SOI layer). Here, a description will be given of a method of forming an N-type transistor and a P-type transistor in a P-type semiconductor film formed on a P-type support substrate via a buried oxide film. However, the same is adapted to a method of forming a transistor in an N-type semiconductor film formed on an N-type support substrate via the buried oxide film.

Figure 5A:
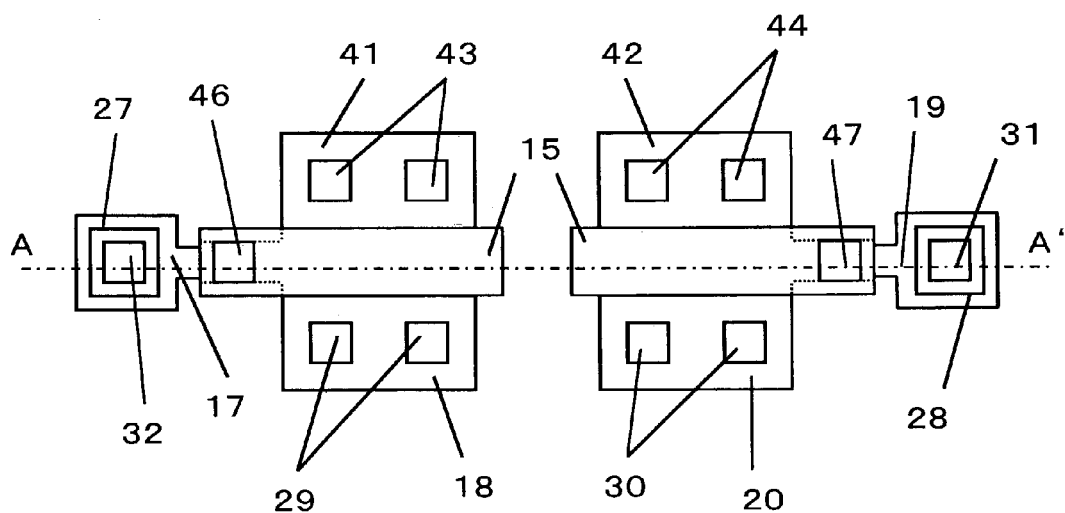
FIGS. 5A and 5B are a top view and a sectional view illustrating a structure of a transistor manufactured by the manufacturing method of the present invention.
Figure 5B:
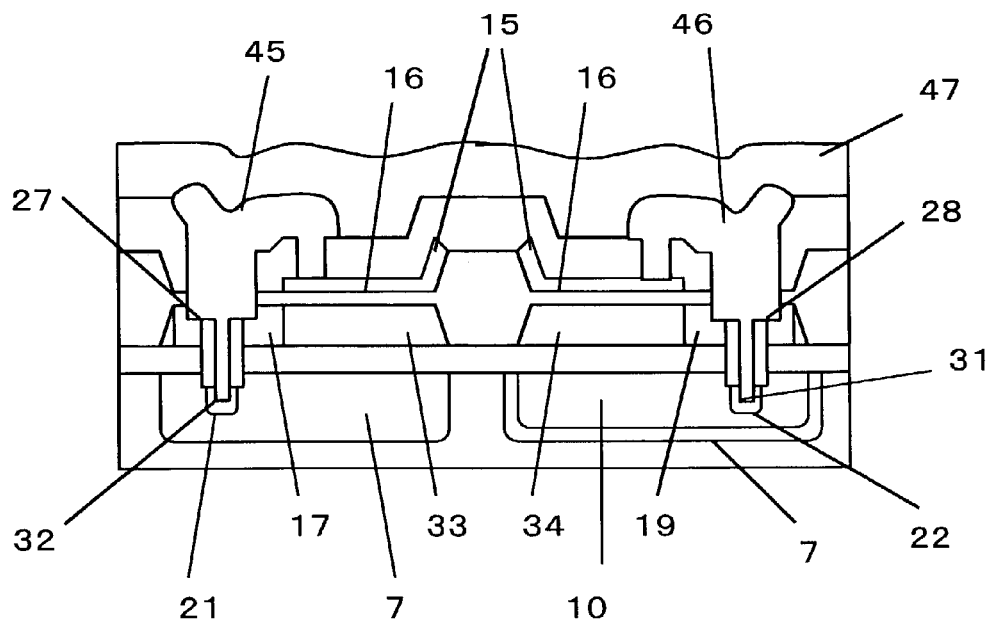
Figure 7A:
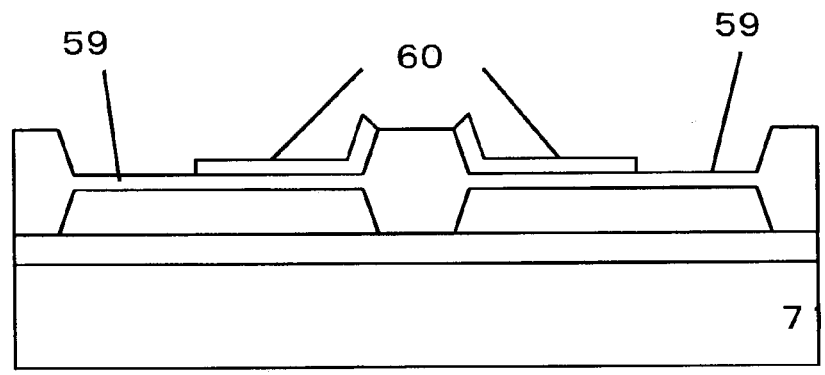
FIGS. 7A to 7C are views illustrating a process flow (2) of the conventional manufacturing method.
Figure 7B:
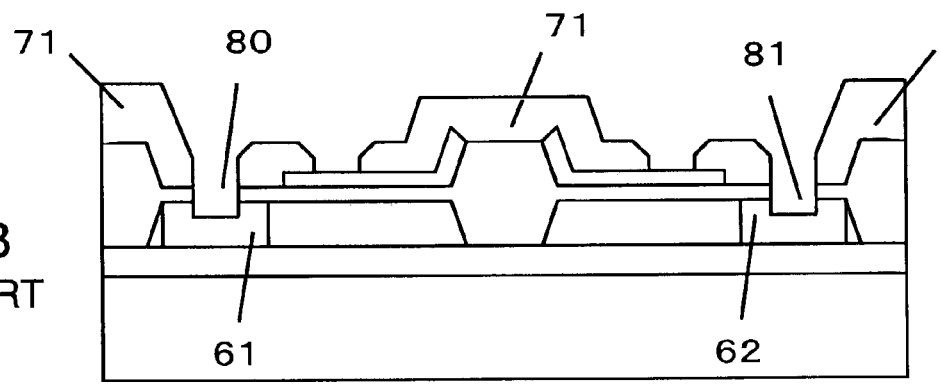
Figure 7C:
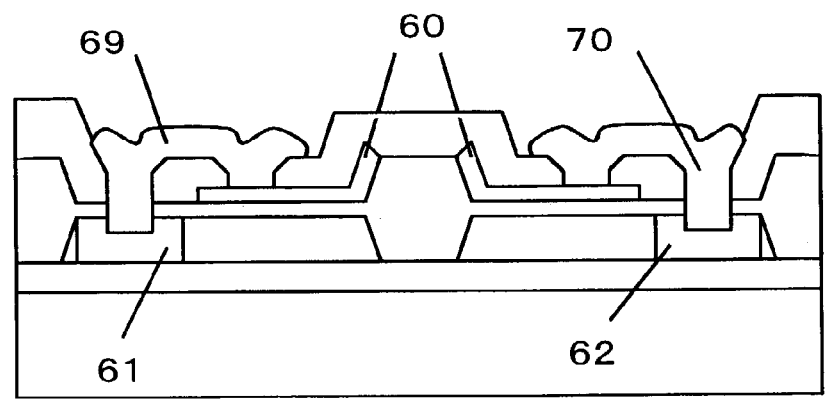
Figure 8A:
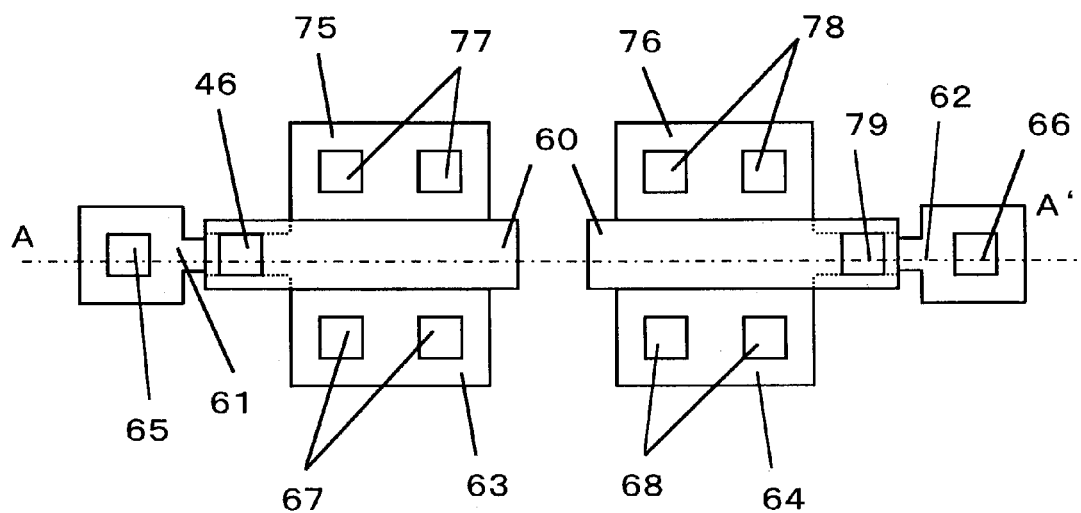
FIGS. 8A and 8B are a top view and a sectional view illustrating a structure of a transistor manufactured by the conventional manufacturing method.
Figure 8B:
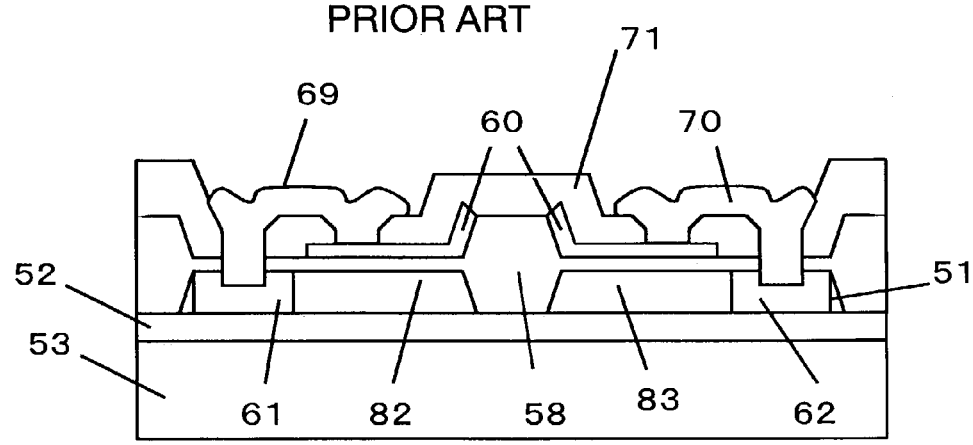

As shown in FIGS. 5A and 5B, a structure of the transistor of the present invention is a gate sub-connection structure in which a gate electrode and a body region are connected to each other. FIG. 5A is a top view illustrating the N-type transistor and the P-type transistor formed on the SOI layer. FIG. 5B is a sectional view taken along the line A–A' of the top view. The respective transistors consist of gate oxide films 16, gate electrodes 15, drain regions 18 and 20, source regions 41 and 42, contacts 43 and 44 of the source regions, contacts 29 and 30 of the drain regions, body regions 33 and 34, body contact regions 17 and 19, body contacts 27 and 28, back regions 7 and 10, back region connection portions 21 and 22, and back region contacts 31 and 32. In addition, a semiconductor integrated circuit according to the present invention has a CMOS structure, so that the respective transistors are composed of a LOCOS 14 for separating elements, a interlayer insulating film 35, wirings 45 and 46, and a protective film 47.

The back regions are required to be separated for each transistor and thus, are formed such that the back region for the P-type transistor becomes the N-type back region 7, whereas the back region for the N-type transistor consists of the N-type back region 7 and the P-type back region 10, which are formed through double diffusion. The back regions 7 and 10 have potentials controlled through the back region connection portions 21 and 22, and the back region contacts 31 and 32. Also, the body regions 33 and 34 of the transistors have potentials controlled through the body contact regions 17 and 19, and the body contacts 27 and 28.

Then, the body contacts 27 and 28 are arranged so as to be concentric with the back region contacts 31 and 32. At the same time, the former is made larger than the latter in size. Thus, the potentials of two regions, i.e., the body region and the back region can be simultaneously controlled through only one contact hole. Further, this structure contributes to reduction of area in the layout as well.

Further, in the transistor according to the present invention, in the case of the P-type transistor, the gate electrode 15 is connected to the body contact 27 and the back region contact 32 of the P-type transistor through the wiring 45. In the case of the N-type transistor, the gate electrode 15 is connected to the body contact 28 and the back region contact 31 of the N-type transistor through the wiring 46.

Next, an operation of the transistor in accordance with the embodiment of the present invention will be described. With the above structure, when a voltage is applied to the gate electrodes 15, the potentials of the body regions 33 and 34, and the back regions 7 and 10 increase simultaneously with the increase in the potential of the gate electrodes 15. At this time, a so-called back gate effect is obtained and a threshold voltage of the transistor is decreasing with the increase in voltage of the gate electrode. Thus, there exhibits an abrupt rising edge in switching. Accordingly, a device optimum to an application for which a high-speed switching operation is required is realized.

Figure 1A:
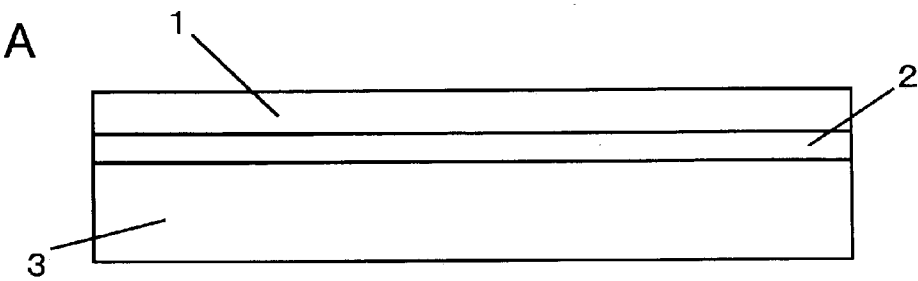
FIGS. 1A to 1E are views illustrating a process flow (1) of a manufacturing method of the present invention.
Figure 1B:
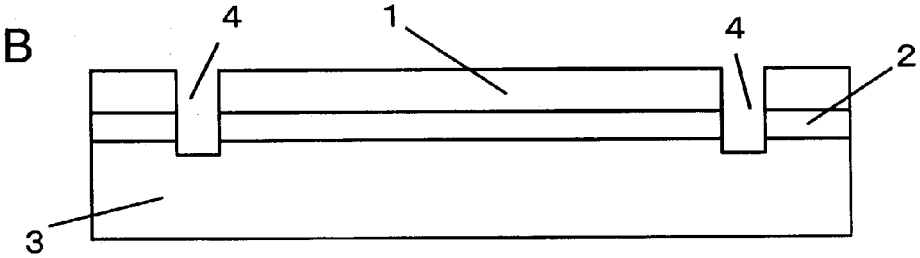

Next, a method of manufacturing the semiconductor integrated circuit described in the embodiment of the present invention will be explained. As shown in FIG. 1A, an SOI wafer having a semiconductor film 1 (thickness: 200 Å to 3000 Å) formed on a support substrate 3 via a buried insulating film 2 is patterned. As shown in FIG. 1B, contact holes 4 are formed in the SOI wafer so as to reach a part of the support substrate 3 through the semiconductor film 1 and the buried insulating film 2 by dry etching or wet etching. Although not shown in FIG. 1B, alignment marks are also formed so as to reach a part of the support substrate 3 through the semiconductor film 1 and the buried insulating film 2, simultaneously with the formation of the contact holes 4. An example of a method of forming the alignment marks includes a method of forming a step using a thermal oxidation process. In the SOI wafer having the semiconductor film 1 (thickness: 200 Å to 3000 Å) as in the present invention, it may be considered that the alignment marks are lost in the course of manufacturing of a CMOS. Also in order to avoid this, it is required to form the alignment marks reaching the support substrate 3. Thus, the present invention is characterized in that the contact holes 4 and the alignment marks are formed simultaneously.

Figure 1C:
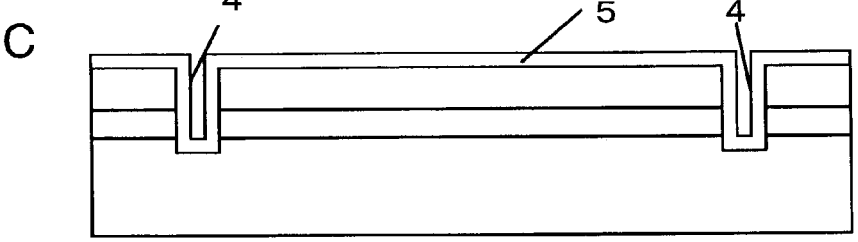

Next, a thermal oxide film 5 with a thickness of about 100 Å is formed (FIG. 1C). The thermal oxide film 5 is formed for the purpose of reducing a damage to the substrate in a process for implanting ions for wells (FIGS. 1D to 2C), forming nitride films 13 (FIG. 2D), and further, preventing chemical liquid from coming into contact with silicon (support substrate 3 and semiconductor film 1) when the nitride films 13 are removed after a LOCOS 14 is formed (FIG. 3B). In general, the thermal oxide film 5 is formed first in the processes for manufacturing a CMOS. However, the manufacturing method of the present invention is characterized in that the thermal oxide film 5 is formed after forming the contact holes 4. If the contact holes 4 are formed after forming the thermal oxide film 5, silicon is exposed in the portions of the contact holes 4 in the subsequent processes. Therefore, there arises a problem in that inconvenience is caused during formation of the nitride films 13, the substrate is damaged while implanting ions for wells, chemical liquid comes into contact with silicon (support substrate 3 and semiconductor film 1) when the nitride films 13 are removed after the LOCOS 14 is formed, or the like. Therefore, it is important that the contact holes 4 are formed before forming the thermal oxide film 5.

Figure 1D:
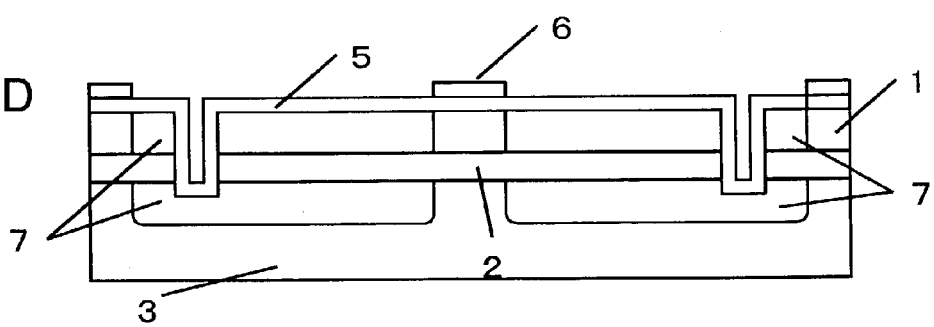

Next, as shown in FIG. 1D, ion implantation is conducted through the thermal oxide film 5, patterning a resist 6 using a mask for forming the LOCOS 14. Thus, the ions are implanted only in openings of the resist 6 to form the N-type back regions 7. At this time, the energy of ion implantation is adjusted so that the peak of a concentration distribution is obtained on the support substrate 3 side (lower side) with respect to the buried insulating film 2. Here, the N-type back regions 7 are formed by the ion implantation through the thermal oxide film 5, the semiconductor film 1, and the buried insulating film 2, so that the N-type back regions 7 are also formed in the semiconductor film 1. Accordingly, the N-type back regions 7 are formed in regions where the transistors are to be formed and in portions opposing the above regions through the buried insulating film 2. Considering a relationship between the thickness of the semiconductor film 1 and the energy of ion implantation, when the thickness of the semiconductor film 1 is large, the energy of ion implantation of the N-type back regions 7 is increased, and the damage of the semiconductor film 1 during ion implantation is increased correspondingly. Furthermore, in the case where the SOI wafer is formed by ion implantation of oxygen, the thickness of the semiconductor film 1 becomes substantially the same as that of the buried insulating film 2. Therefore, the energy of ion implantation of the N-type back regions 7 is further increased. In view of this, the thickness of the semiconductor film 1 is preferably small. When the energy of ion implantation of the N-type back regions 7 is equal to or more than 500 keV, the characteristics are degraded due to the damage. Therefore, the thickness of the semiconductor film 1 is desirably equal to or smaller than 3000 Å.

Figure 1E:
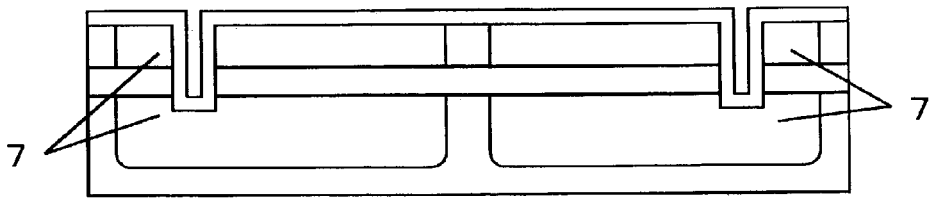

Next, as shown in FIG. 1E, the N-type back regions 7 are thermally diffused. It is necessary to previously perform the thermal diffusion of the N-type back regions 7, since the P-type back region 10 of the N-type transistor is formed in the N-type back region 7 in a process shown in FIG. 2B.

Figure 2A:
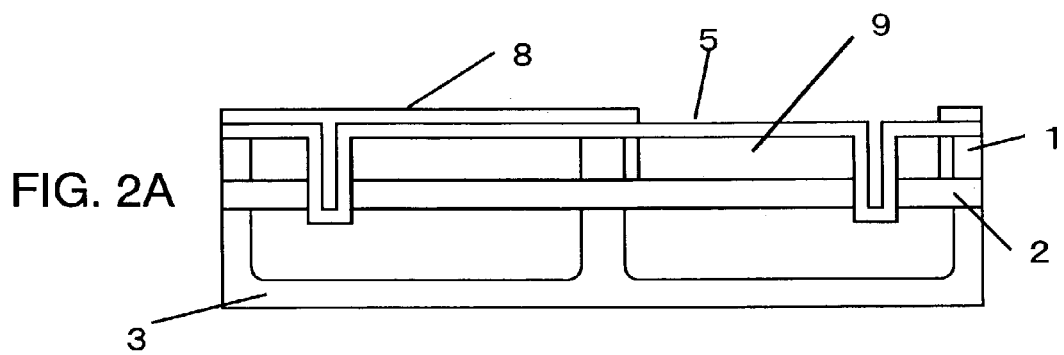
FIGS. 2A to 2D are views illustrating a process flow (2) of the manufacturing method of the present invention.

Further, as shown in FIG. 2A, ion implantation is performed on a region where the N-type transistor is to be formed, through the thermal oxide film 5 with a resist 8 used as a mask to thereby form a P well 9. At this time, the energy of ion implantation is adjusted so that the peak of concentration distribution exists in the semiconductor film 1.

Figure 2B:
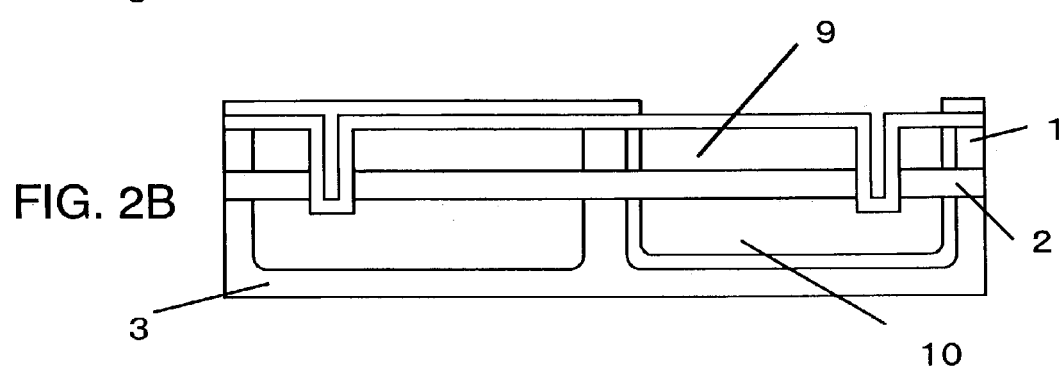

Then, as shown in FIG. 2B, while using the same resist 8 as a mask, ions are implanted in a region opposing the P well 9 across the buried insulating film 2 on the support substrate 3 to form the P-type back region 10. The energy of ion implantation is adjusted so that the peak of a concentration distribution is obtained on the support substrate 3 side from an interface between the support substrate 3 and the buried insulating film 2. Also, in order to surround the P-type back region 10 by the N-type back region 7, the energy of ion implantation is adjusted so as to make the depth of the P-type back region 10 smaller than that of the N-type back region 7.

Figure 2C:
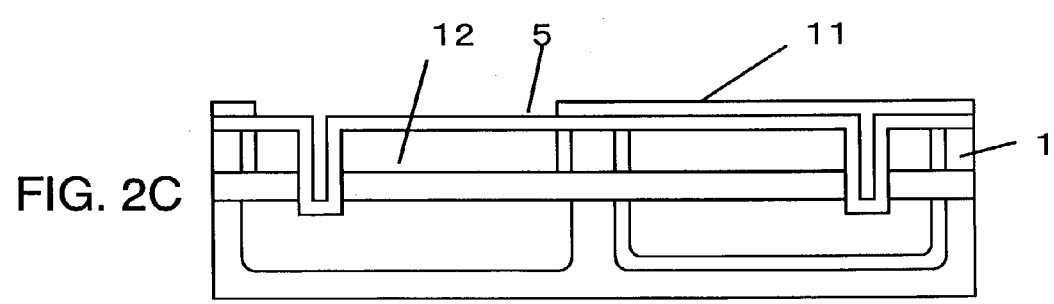

Next, as shown in FIG. 2C, ion implantation is conducted on the region where the P-type transistor is to be formed using a resist 11 as a mask through the thermal oxide film 5 to form an N well 12. At this time, the energy of ion implantation is adjusted so that the peak of concentration distribution exists in the semiconductor film 1.

Figure 2D:
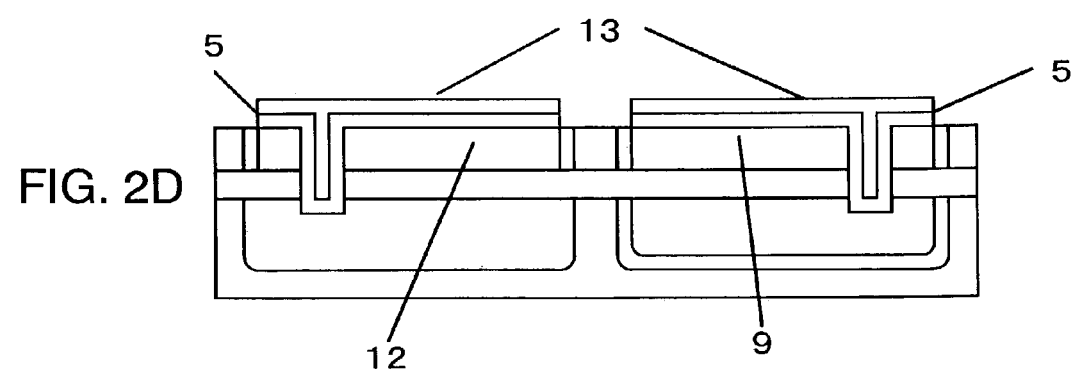
Figure 3A:
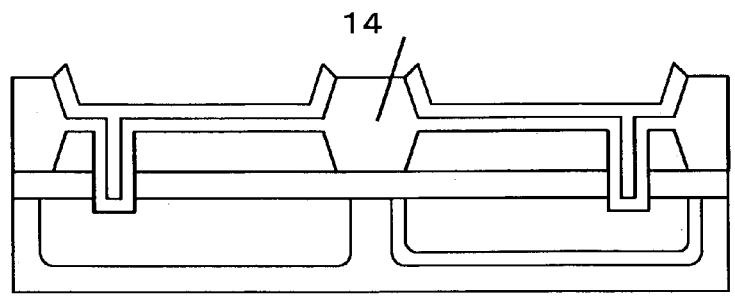
FIGS. 3A to 3D are views illustrating a process flow (3) of the manufacturing method of the present invention.
Figure 3B:
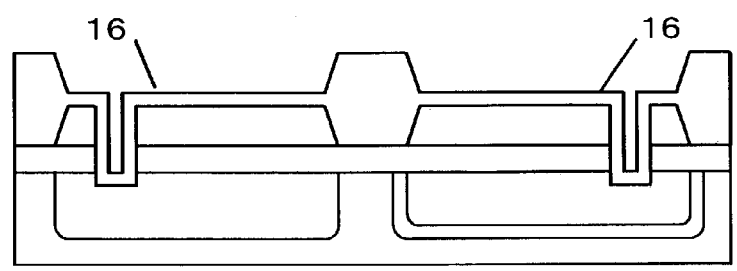

Next, the LOCOS 14 of FIG. 3A is formed. As shown in FIG. 2D, the nitride films 13 are formed to have a thickness of about 1600 Å on the thermal oxide films 5 with the resist 11 removed therefrom. Then, alignment and exposure to light are conducted, and the LOCOS 14 is patterned. The nitride films 13 are etched to open a LOCOS formation portion. FIG. 2D shows a state where masks of the thermal oxide films 5 and the nitride films 13 are formed on the P well 9 region and the N well 12 region. In this state, the resultant is placed in a thermal oxidation furnace, and the LOCOS 14 is formed as shown in FIG. 3A. The thickness of the LOCOS 14 is set so that the LOCOS 14 reaches the buried insulating film 2 on the support substrate 3. Herein, the P well 9, the P-type back region 10, and the N well 12 are activated simultaneously during this thermal oxidation process. After the LOCOS 14 is formed, the nitride films 13 are removed, and the oxide films in the portions other than the LOCOS 14 are all removed, so that gate oxide films 16 are formed as shown in FIG. 3B.

Figure 3C:
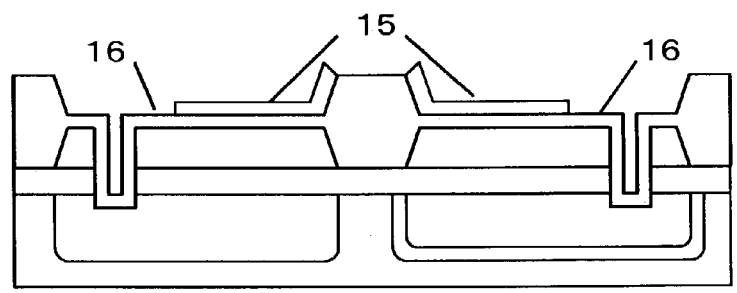
Figure 3D:
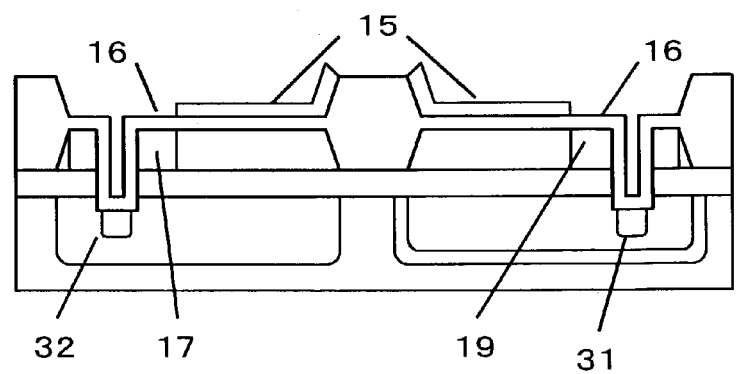

The subsequent processes proceed through the same steps as in the ordinary manufacturing process of a CMOS. As shown in FIG. 3C, after polysilicon is formed into a film, alignment and exposure to light are conducted, and the gate electrodes 15 are patterned. Then, polysilicon is etched by dry etching to form the gate electrodes 15. The, polysilicon is oxidized and ion implantation of N-type and P-type source drain regions is connected. Although the source/drain regions are not shown in the sectional views of FIGS. 1A to 4C, as shown in FIG. 3D, the drain region 41 and the source region 18 of the P-type transistor, the body contact region 19 of the N-type transistor, and the back region contact 31 of the Ntype transistor are formed through one ion implantation process. Similarly, the drain region 42 and the source region 20 of the N-type transistor, the body contact region 17 of the P-type transistor, and the back region contact 32 of the P-type transistor are formed through one ion implantation process.

Figure 4A:
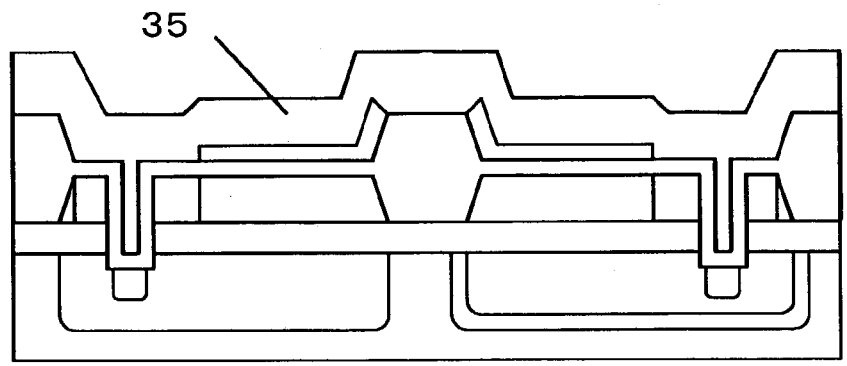
FIGS. 4A to 4C are views illustrating a process flow (3) of the manufacturing method of the present invention.
Figure 4B:
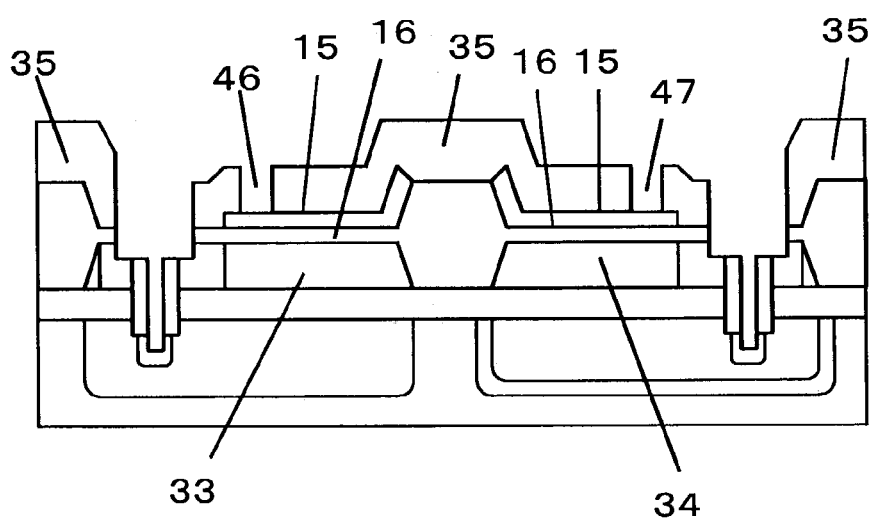

Then, as shown in FIG. 4A, the interlayer insulating film 35 is formed, followed by formation of the contacts of the transistor. As shown in FIG. 4B, the resist is applied onto the interlayer insulating film 35 and then alignment and exposure to light are conducted to perform patterning and etching of the contacts. Contacts 46 and 47 of the gate electrodes are formed by etching so as to reach a part of the gate electrodes 15 through the interlayer insulating film 35.

Contacts 29, 30, 43, and 44 of the source/drain regions are formed by etching so as to reach a part of the semiconductor film 1 through the interlayer insulating film 35 and the gate oxide films 16. Therefore, although not shown in FIG. 4B, as shown in FIG. 5A, the drain region 18 of the P-type transistor is connected to a wiring through the contacts 29 of the drain region, whereas the source region 41 of the P-type transistor is connected to a wiring through the contacts 43 of the source region. The drain region 20 of the N-type transistor is connected to a wiring through the contacts 30 of the drain region, whereas the source region 42 of the N-type transistor is connected to a wiring through the contacts 44 of the source region.

The body contacts 27 and 28 are formed by etching so as to reach a part of the semiconductor film 1 through the interlayer insulating film 35 and the gate oxide films 16.

Figure 4C:
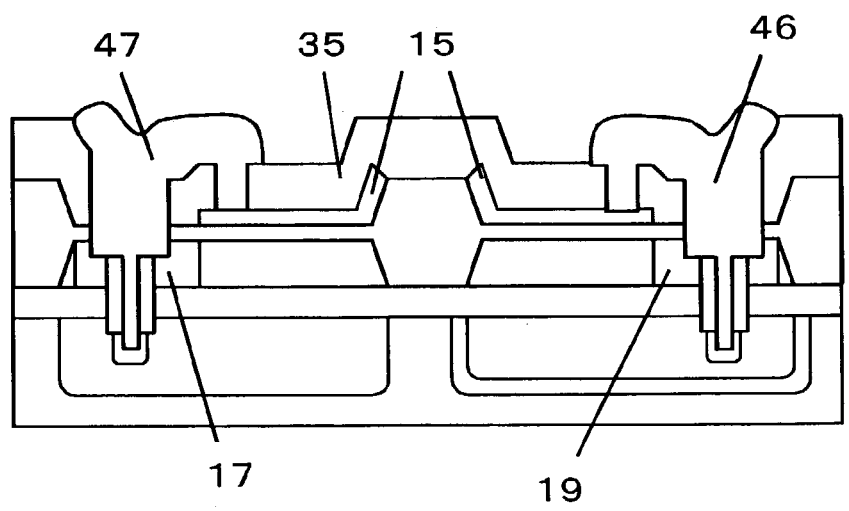

The back region contacts 31 and 32 are formed by etching so as to reach a part of the support substrate 3 through the interlayer insulating film 35 and the gate oxide films 16. Here, as shown in the top view of FIG. 5A, the back region contacts 31 and 32 are formed concentrically inside the body contacts 27 and 28. Thus, when the etching is conducted on the body contacts 27 and 28, the back region contacts 31 and 32 are simultaneously etched. Then, as shown in FIG. 4C, the body region 33 of the P-type transistor is connected to the wiring 45 through the body contact region 17 and the body contact 27. In addition, the wiring 45 is connected to the N-type back region 7 through the back region contact 32 and the back region connection portion 21. Also, the body region 34 of the N-type transistor is connected to the wiring 46 through the body contact region 19 and the body contact 28. In addition, the wiring 46 is connected to the P-type back region 10 through the back region contact 31 and the back region connection portion 22.

Next, as shown in FIG. 4C, metal is formed into a film, a resist is applied, and alignment and exposure to light are conducted, so that patterning and etching of the wirings 45 and 46 for connecting the gate electrodes 15 and the body contact regions 17 and 19 are performed. Thereafter, as shown in FIG. 5B, the protective film 47 is formed on the wirings, and a bonding pad is formed to complete a semiconductor integrated circuit.

According to the present invention, the thickness of the semiconductor film 1 on the insulating film is set to 200 Å to 3000 Å. The reason for this is as follows. In the above-mentioned process, an oxide film with a thickness of about 300 Å is formed during the thermal oxidation process. Therefore, in order to form a MOS transistor on the semiconductor film 1, it is required that the thickness of the semiconductor film 1 is at least 200 Å or more for formation. On the other hand, if the semiconductor film 1 is thick, as described above, the energy of ion implantation of the back regions 7 and 10 is increased, which correspondingly increases the damage of the semiconductor film 1 due to the ion implantation. Therefore, the thickness of the semiconductor film 1 is about 3000 Å.

According to the above structure described in the embodiment of the present invention, in the transistors, the potentials of the gate electrodes 15, the body regions 33 and 34, and the back regions 7 and 10 can be readily made equal to each other. Thus, when the voltage is applied to the gate electrodes 15, the potentials of the body regions 33 and 34, and the back regions 7 and 10 are increased with the increase in potential of the gate electrodes 15 due to the above structure. At this time, a so-called back gate effect is obtained and the threshold voltage of the transistors is decreasing with the increase in voltage of the gate electrodes, thereby achieving an abrupt rising edge in switching. Accordingly, a device optimum to an application for which a high-speed switching operation is required is realized.

Furthermore, in the SOI transistor from a structural view, there is a transistor in which the support substrate is considered as a gate electrode, and the buried insulating film is considered as a gate oxide film. Therefore, particularly in the case of a P-type transistor, a threshold voltage in a back side transistor is low, which causes a withstand voltage to decrease. However, in the SOI transistor according to the present invention, the gate electrode of the back side transistor of the P-type transistor is of an N-type, so that the threshold voltage increases due to work function difference to thereby increase the withstand voltage.

Also, the manufacturing method of the present invention is characterized in that the thermal oxide film 5 is formed after forming the contact holes 4. If the contact holes 4 are formed after forming the thermal oxide film 5, silicon is exposed in the portions of the contact holes 4 in the subsequent processes. Therefore, there arises a problem in that inconvenience is caused during formation of the nitride films 13, the substrate is damaged while implanting ions for wells, chemical liquid comes into contact with silicon (support substrate 3 and semiconductor film 1) when the nitride films 13 are removed after the LOCOS 14 is formed, or the like. Therefore, it is important that the contact holes 4 are formed before forming the thermal oxide film 5. Moreover, the contact holes 4 are formed simultaneously with the imprinting of the alignment marks, which contributes to decrease in the number of processes as well.

The present invention is carried out in the embodiment as described above and has the following effects.

The method of manufacturing the semiconductor integrated circuit according to the present invention in which the CMOS transistor is formed on the semiconductor film of a first conductivity type formed on the support substrate of a first conductivity type via the buried insulating film, includes: forming at least one contact hole in a source-body-tie region adjacent to the body region under the source region and the gate electrode of the transistor so that the contact hole reaches a part of the support substrate through the semiconductor film and the buried insulating film on the support substrate, together with the alignment marks; forming the thermal oxide film on an inner side of the contact hole on the semiconductor film; forming the impurity regions of a second conductivity type in the regions where the transistors of a first conductivity type and a second conductivity type are to be formed, which reach an inner portion of the support substrate under the buried insulating film; performing thermal diffusion on the impurity regions of a second conductivity type; forming the impurity region of a first conductivity type in the region where the transistor of a second conductivity type is to be formed, which reaches the buried insulating film on the semiconductor film; forming the impurity region of a first conductivity type in the portion on the support substrate and opposing the impurity region of a first conductivity type with respect to the buried insulating film; forming the impurity region of a second conductivity type in the region where the transistor of a first conductivity type is to be formed, which reaches the buried insulating film on the semiconductor film; forming the gate oxide film, the gate electrode, the source region, and the drain region after separating elements, and forming the interlayer insulating film; forming the contacts of the source region and the drain region, and simultaneously, etching the interlayer insulating film so as to be concentric with the contact hole and to have a size surrounding the contact hole; and forming the wiring on the interlayer insulating film.

According to the method of the present invention, it is possible to readily make equal the potentials of the gate electrode 15 of the transistor, the body region, and the first well 7 or the second P well. In particular, the contact holes are formed and the thermal oxidation is performed in the stated order fixedly, whereby the contact holes 4 can be formed without any damage to the semiconductor film 1 and the support substrate 3. Moreover, the contact holes 4 are formed simultaneously with the imprinting of the alignment marks, which contributes to decrease in the number of processes as well.

Also, according to the present invention, the body contact region is connected with the gate electrode to achieve a gate sub-connection structure, whereby it is possible to allow a body potential of the transistor and a potential on the support substrate below the transistor to vary in accordance with change in the potential of the gate electrodes. Thus, ideal subthreshold characteristics can be obtained. As a result, the semiconductor integrated circuit with high performance can be realized.

Furthermore, in the SOI transistor from a structural view, there is a transistor in which the support substrate is considered as the gate electrode, and the buried insulating film is considered as the gate oxide film. Therefore, particularly in the case of the P-type transistor, a threshold voltage in the back side transistor is low, which causes a withstand voltage to decrease. However, in the SOI transistor according to the present invention, the gate electrode of the back side transistor of the P-type transistor is of an N-type, whereby an effect is obtained such that the threshold voltage increases due to work function difference to increase the withstand voltage as well.

What is claimed is:

1. A method of manufacturing a semiconductor integrated circuit having first and second conductivity type CMOS transistors, comprising the steps of:

providing an SOI substrate having a semiconductor film of a first conductivity type provided on a support substrate of a first conductivity type via a buried insulating film;

simultaneously forming at least one alignment mark and a contact hole for each CMOS transistor in the SOI substrate, the at least one alignment mark and the corresponding contact hole extending through the semiconductor film and the buried insulating film and into the support substrate, the contact holes being formed in a source-body-tie region of the CMOS transistors and being formed adjacent to regions where a source region and a body region of the CMOS transistors are to be formed;

forming a thermal oxide film on the semiconductor film to cover an inside of the contact holes;

forming second conductivity type impurity regions in the support substrate in regions where the first and second conductivity type CMOS transistors are to be formed;

performing a thermal process to diffuse impurities in the second conductivity type impurity regions;

forming a first conductivity type impurity region in the semiconductor film so as to reach the buried insulating film in a region where the second conductivity type CMOS transistor is to be formed;

forming a first conductivity type impurity region in a region of the support substrate surrounded by one of the second conductivity type impurity regions and disposed opposite to the first conductivity type impurity region formed in the semiconductor film;

forming a second conductivity type impurity region in the semiconductor film so as to reach the buried insulating film in a region where the first conductivity type CMOS transistor is to be formed;

forming gate oxide films, gate electrodes, source regions, drain regions, and body regions of the CMOS transistors;

forming an interlayer insulating film over the CMOS transistors;

etching the interlayer insulating film so as to form source region contacts, drain region contacts, and body contacts for each of the CMOS transistors; and forming wiring on the interlayer insulating film.

2. A method of manufacturing a semiconductor integrated circuit according to claim 1; wherein a thickness of the semiconductor film is in the range of 200 Å to 3000 Å.

3. A method of manufacturing a semiconductor integrated circuit according to claim 1; wherein the contact holes are formed concentric with the body contacts for taking on potentials of the body regions of the CMOS transistors.

4. A method of manufacturing a semiconductor integrated circuit according to claim 1; wherein the thermal oxide film has a thickness of about 100 Å.

5. A method of manufacturing a semiconductor integrated circuit according to claim 1; wherein the first conductivity type is P-type and the second conductivity type is N-type.

6. A method of manufacturing a semiconductor integrated circuit according to claim 1; wherein the step of forming source region contacts, drain region contacts, and body contacts is performed by a single ion implantation process.

7. A method of manufacturing a semiconductor integrated circuit according to claim 6; further comprising the step of forming a metal wiring layer to connect the contact holes to the gate electrodes of the CMOS transistors.

8. A method of manufacturing a semiconductor integrated circuit having first and second conductivity type CMOS transistors, comprising the steps of:

providing an SOI substrate having a semiconductor film of a first conductivity type provided on a support substrate of a first conductivity type via a buried insulating film;

simultaneously forming at least one alignment mark and a contact hole for each CMOS transistor in the SOI substrate, the at least one alignment mark and the corresponding contact hole extending through the semiconductor film and the buried insulating film and into the support substrate, the contact holes being formed in a source-body-tie region of the CMOS transistors and being formed adjacent to regions where a source region and a body region of the CMOS transistors are to be formed forming a thermal oxide film on the semiconductor film to cover an inside of the contact holes;

forming second conductivity type back regions of the first and second conductivity type CMOS transistors in the support substrate;

forming a first conductivity type impurity region in the semiconductor film for the second conductivity type CMOS transistor;

forming a first conductivity type back region in a region of the support substrate surrounded by one of the second conductivity type back regions and disposed opposite to the first conductivity type impurity region;

forming a second conductivity type impurity region in the semiconductor film for the first conductivity type CMOS transistor;

forming gate oxide films, gate electrodes, source regions, drain regions, and body regions of the CMOS transistors;

forming an interlayer insulating film over the CMOS transistors;

etching the interlayer insulating film to form source region contacts, drain region contacts, and body contacts for each of the CMOS transistors; and forming wiring on the interlayer insulating film.

9. A method of manufacturing a semiconductor integrated circuit according to claim 8; wherein a thickness of the semiconductor film is in the range of 200 Å to 3000 Å.

10. A method of manufacturing a semiconductor integrated circuit according to claim 8; wherein the step of forming source region contacts, drain region contacts, and body contacts is performed by a single ion implantation process.

11. A method of manufacturing a semiconductor integrated circuit according to claim 8; wherein the thermal oxide film has a thickness of about 100 Å.

12. A method of manufacturing a semiconductor integrated circuit according to claim 8; wherein the first conductivity type is P-type and the second conductivity type is N-type.

13. A method of manufacturing a semiconductor integrated circuit according to claim 8; wherein the contact holes are formed concentric with the body contacts for taking on potentials of the body regions of the CMOS transistors.

14. A method of manufacturing a semiconductor integrated circuit according to claim 13; further comprising the step of forming a metal wiring layer to connect the contact holes to the gate electrodes of the CMOS transistors.

15. A method of fabricating first and second conductivity type CMOS transistors in an SOI substrate, comprising the steps of:

providing an SOI substrate comprised of a second conductivity type semiconductor substrate, an insulating film provided on the semiconductor substrate, and a second conductivity type semiconductor film provided on the insulating film;

etching a contact hole for each CMOS transistor through the semiconductor film and the buried insulating film to extend into the semiconductor substrate, and simultaneously etching at least one alignment mark through the semiconductor film and the buried insulating film to extend into the semiconductor substrate;

forming a thermal oxide film on the semiconductor layer to cover an inside of the contact holes;

performing a first ion implantation process by implanting ions through the thermal oxide film to form first conductivity type back regions of the first and second conductivity type CMOS transistors in the semiconductor substrate;

performing a thermal process to diffuse the first conductivity type back regions;

performing a second ion implantation process to form a second conductivity type well of the first conductivity type CMOS transistor in the semiconductor film;

performing a third ion implantation process through the thermal oxide film to form a second conductivity type back region in the semiconductor substrate surrounded by one of the first conductivity type back regions and disposed opposite to the second conductivity type well of the first conductivity type CMOS transistor;

performing a fourth ion implantation process to form a first conductivity type well region of the second conductivity type CMOS transistor in the semiconductor film;

forming gate oxide films, gate electrodes, source regions, drain regions, and body regions of the first and second conductivity type CMOS transistors;

forming an interlayer insulating film over the CMOS transistors;

etching the interlayer insulating film to form source region contacts, drain region contacts, and body contacts for each of the CMOS transistors; and forming wiring on the interlayer insulating film.

16. A method of fabricating CMOS transistors according to claim 15; wherein the semiconductor film has a thickness in the range of about 200 Å to 3000 Å.

17. A method of fabricating CMOS transistors according to claim 15; wherein the thermal oxide film has a thickness of about 100 Å.

18. A method of fabricating CMOS transistors according to claim 15; wherein the thermal oxide film has a thickness sufficient to reduce damage to the SOI substrate caused by the ion implantation steps.

19. A method of fabricating CMOS transistors according to claim 15; wherein the first conductivity type is P-type and the second conductivity type is N-type.

20. A method of fabricating CMOS transistors according to claim 15; wherein an energy of the first ion implantation process is set so that a peak of a concentration distribution of the implanted ions is obtained in the semiconductor substrate.

21. A method of fabricating CMOS transistors according to claim 15; wherein an energy of the first ion implantation process is less than 500 kev.

22. A method of fabricating CMOS transistors according to claim 15; wherein the step of performing the first ion implantation process is performed using a first resist mask.

23. A method of fabricating CMOS transistors according to claim 15; wherein the contact holes are formed concentric with the body contacts for taking on potentials of the body regions of the CMOS transistors.

24. A method of fabricating CMOS transistors according to claim 22; further comprising the step of forming a LOCOS region between the CMOS transistors using a second resist mask.

25. A method of fabricating CMOS transistors according to claim 15; wherein the second ion implantation process is performed using a photoresist mask.

26. A method of fabricating CMOS transistors according to claim 25; wherein the third ion implantation process is performed using the photoresist mask.

27. A method of fabricating CMOS transistors according to claim 26; further comprising the step of forming a metal wiring layer to connect the contact holes to the gate electrodes of the CMOS transistors.

* * * * *